US008766086B2

(12) United States Patent
Maheshwari et al.

(10) Patent No.: US 8,766,086 B2
(45) Date of Patent: Jul. 1, 2014

(54) SYSTEM AND METHOD FOR LAMINATING PHOTOVOLTAIC STRUCTURES

(75) Inventors: Abhay Maheshwari, Monte Sereno, CA (US); Raghunandan Chaware, Mountain View, CA (US)

(73) Assignee: Solaria Corporation, Fremont, CA (US)

( * ) Notice: Subject to any disclaimer, the term of this patent is extended or adjusted under 35 U.S.C. 154(b) by 308 days.

(21) Appl. No.: 12/888,037

(22) Filed: Sep. 22, 2010

(65) Prior Publication Data

US 2012/0067398 A1     Mar. 22, 2012

(51) Int. Cl.
*H01L 31/0232*     (2014.01)

(52) U.S. Cl.
USPC ........................... 136/246; 136/259; 136/251

(58) Field of Classification Search
USPC ........ 136/244, 243, 246, 259, 251; 156/273.7
See application file for complete search history.

(56) References Cited

U.S. PATENT DOCUMENTS

| | | | | |
|---|---|---|---|---|
| 5,096,505 A | * | 3/1992 | Fraas et al. | 136/246 |
| 5,994,641 A | * | 11/1999 | Kardauskas | 136/246 |
| 2005/0225864 A1 | * | 10/2005 | Kornrumpf et al. | 359/619 |
| 2009/0056806 A1 | * | 3/2009 | Gibson et al. | 136/259 |
| 2010/0101647 A1 | * | 4/2010 | Cadwallader et al. | 136/259 |
| 2010/0218804 A1 | * | 9/2010 | Shin et al. | 136/246 |
| 2011/0048497 A1 | * | 3/2011 | Okamoto et al. | 136/246 |
| 2011/0192445 A1 | * | 8/2011 | Solzbacher et al. | 136/246 |

* cited by examiner

*Primary Examiner* — Jayne Mershon
(74) *Attorney, Agent, or Firm* — Richard T. Ogawa; Ogawa P.C.

(57) ABSTRACT

A method for forming a laminated photovoltaic structure includes providing a sheet of transparent material having light concentrating features, disposing adhesive material adjacent to the sheet of transparent material, disposing photovoltaic strips adjacent to the adhesive material, wherein the photovoltaic strips are positioned relative to the sheet of transparent material in response to exitant light characteristics of the light concentrating features, wherein photovoltaic strips are coupled via associated bus bars, wherein gap regions are located between bus bars of neighboring photovoltaic strips, disposing a rigid layer of material adjacent to the photovoltaic strips to form a composite photovoltaic structure; and thereafter laminating the composite photovoltaic structure to fill the gap regions with adhesive material and to form the laminated photovoltaic structure, wherein adhesive material adheres to the bus bars.

10 Claims, 7 Drawing Sheets

SYSTEM AND METHOD FOR LAMINATING PHOTOVOLTAIC STRUCTURES

BACKGROUND OF THE INVENTION

The present invention relates to photovoltaic energy sources. More particularly, the present invention relates to using photovoltaic (PV) strips to convert solar energy into electrical energy.

The inventors of the present invention have determined that a challenge with using PV strips for capturing solar energy is how to effectively direct and concentrate incident light/radiation to PV strips. Another challenge is how to manufacture such concentrators with materials that can last the expected life span of a solar panel, or the like, e.g. over 20 years.

One possible solution considered was with the use of a metal concentrator in front of a PV strip. Drawbacks to such solutions include that a metal concentrator would be bulky and would cause the thickness of the solar panel to increase greatly. Another drawback includes that exposed metal may corrode and lose reflecting capability as it ages.

Another possible solution, considered by the inventors, was the use of a thin clear, polycarbonate layer on top of the PV strips. In such configurations, a number of v-shaped grooves were molded into the polycarbonate layer that acted as prisms. Incident light to the prisms would thus be directed to PV strips located within the v-shaped grooves.

One possible drawback to such solutions considered by the inventors is the durability and longevity of such polycarbonate layers, or the like. More specifically, the long-term (20+ years) translucency (e.g. hazing, cracking), geometric property stability (e.g. shrink-free), or the like cannot be predicted with certainty. Additionally, another aspect determined by the inventors that could have a bearing upon longevity was effect of gaps, e.g. air gaps between PV strips and wiring within a PV cell.

Accordingly, what is desired are improved methods for manufacturing PV cells or structures and resulting PV cells or structures.

BRIEF SUMMARY OF THE INVENTION

The present invention relates to photovoltaic energy sources. More particularly, the present invention relates to using photovoltaic (PV) strips to convert solar energy into electrical energy.

According to various embodiments of the present invention, incident light concentrators are manufactured from a transparent or translucent material (e.g. glass, acrylic) and are placed adjacent to PV strips. The PV strips are typically interconnected via a series of bus bars. In various embodiments, a sheet of material, e.g. glass, is extruded having a cross-section including a series semicircular shaped regions. In operation, each semicircular-shaped region acts as a solar concentrator to redirect sun light, e.g. parallel light, towards a smaller region on the surface opposite of the semicircular-shaped region.

In various embodiments, the geometric concentration characteristics of a semicircular-shaped region is characterized based upon a parallel light source and light detector along its length. This characterization is repeated for multiple semicircular-shaped regions on the concentrator sheet.

In various embodiments, the characterization data may be used as input for a PV strip placement operation with respect to the sheet of material. For example, such characterization data may be used by a user to determine where to place a PV strip relative to the sheet of material. As another example, such characterization data may be used by a machine or device that can pick PV strips and accurately position the PV strip relative to the sheet of material. In various embodiments, the placement of the PV strip relative to the sheet of material maximizes the capture of solar light by the PV strip.

In various embodiments, a controlled lamination process is performed to reduce the empty space (e.g. air) between gaps between PV strips, bus bars, or other wiring within the resultant PV assembly. The empty space may be filled with material, such as adhesive material. More specifically, a lamination process is performed that includes the application of a controlled compression pressure profile upon the PV structure during the lamination process. In various embodiments, a compression pressure of approximately ¼ atmospheric pressure, e.g. approximately 25 kPA is applied to the PV assembly for approximately 20 to 30 seconds, e.g. 25 seconds. This is followed by application of a compression pressure of approximately ½ atmospheric pressure, e.g. approximately 50 kPA is applied to the PV assembly for approximately 30 to 40 seconds, e.g. 35 seconds. In various embodiments the compression pressure is applied to the PV structure within a heated vacuum chamber sufficient to melt the adhesive material (e.g. at least 120 degrees C., at least 150 degrees C., or the like).

According to one aspect of the invention, a method for forming a laminated photovoltaic structure is disclosed. One technique includes providing a sheet of transparent material having a plurality of light concentrating geometric features, and disposing a first layer of adhesive material adjacent to the sheet of transparent material. A process includes disposing a plurality of photovoltaic strips adjacent to the first layer of adhesive material, wherein the plurality of photovoltaic strips are positioned relative to the sheet of transparent material in response to exitant light characteristics of the plurality of light concentrating geometric features, wherein each of the plurality of photovoltaic strips are coupled via an associated plurality of bus bars, wherein a plurality of gap regions are located between bus bars of neighboring photovoltaic strips. A method includes disposing a rigid layer of material adjacent to the plurality of photovoltaic strips to form a composite photovoltaic structure; and thereafter laminating the composite photovoltaic structure to fill the plurality of gap regions with adhesive material and to form the laminated photovoltaic structure, wherein adhesive material adheres to the bus bars.

According to one aspect of the invention, a laminated photovoltaic structure comprising is described. One device includes a sheet of transparent material having a plurality of light concentrating geometric features. An apparatus includes a first layer of adhesive material disposed adjacent to the sheet of transparent material. A system may include a plurality of photovoltaic strips disposed adjacent to the first layer of adhesive material, wherein the plurality of photovoltaic strips are positioned relative to the sheet of transparent material in response to exitant light characteristics of the plurality of light concentrating geometric features, wherein the plurality of photovoltaic strips are coupled via a plurality of bus bars, wherein gap regions are defined between bus bars of neighboring photovoltaic strips. In various embodiments, a sheet of transparent material, the plurality of photovoltaic strips, and the first layer of adhesive material form a composite photovoltaic structure. In various embodiments, the plurality of gap regions between the plurality of photovoltaic strips are subsequently filled by the adhesive material after the composite photovoltaic structure is subject to a lamination process.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE INVENTION

Figure 1A:
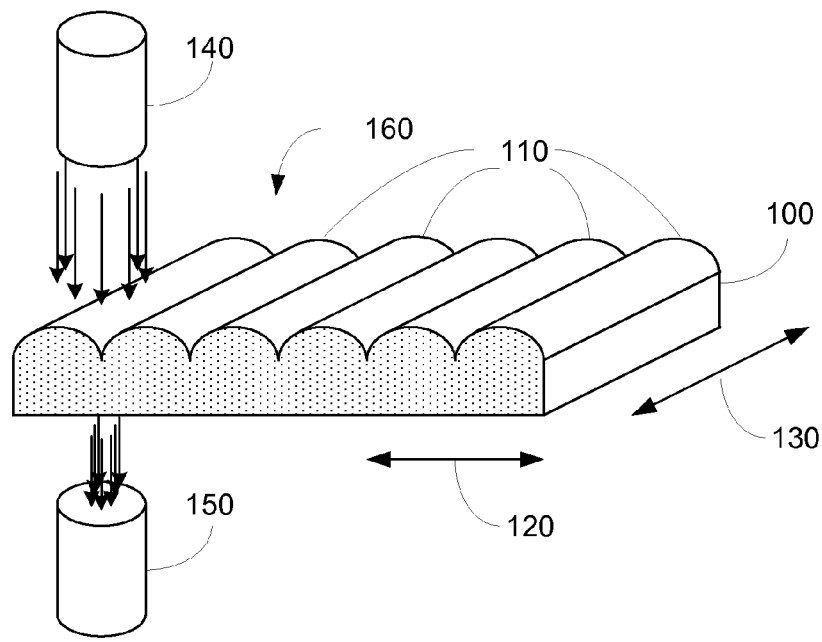
FIGS. 1A-B illustrate various aspects according to embodiments of the present invention.
Figure 1B:
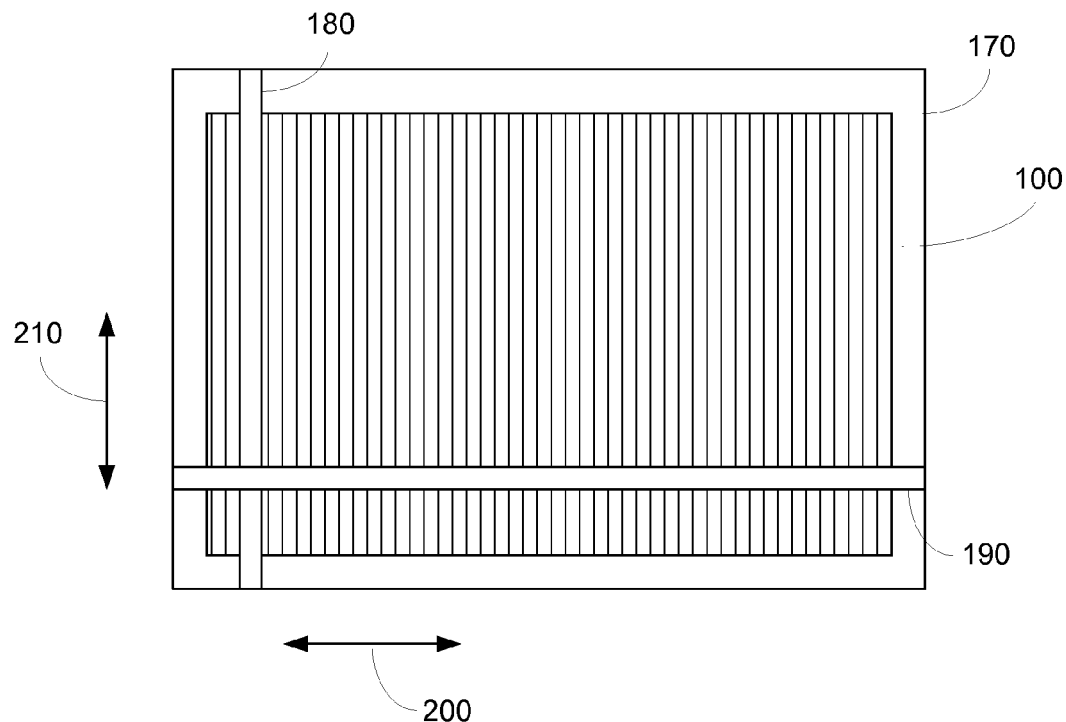

FIGS. 1A-B illustrate various aspects according to embodiments of the present invention. More specifically, FIGS. 1A-B illustrate apparatus for determining concentration characteristics of a sheet of material 100.

In FIG. 1A, an embodiment of a sheet of transparent/translucent material 100 is shown. As can be seen, sheet 100 may include a number of concentrating elements 110 in a first direction 120. In one example, there are approximately 175 concentrating elements across sheet 100, although in other examples, the number of concentrating elements may vary. In various examples, the nominal pitch of concentrating elements 110 ranges from approximately 5.5 mm to 6 mm.

In various embodiments, sheet 100 may be manufactured as a sheet of extruded material, accordingly, the concentrating elements may extend in a second direction 130, as shown. In other embodiments, the concentrating elements may vary in second direction 130.

In various embodiments of the present invention, a light source 140 and a light detector 150 may also be provided. In various embodiments, light source 140 may provide collimated light to the surface 160 of material 100 having concentrating elements 110. In various embodiments, light source 140 may include LED lights, stroboscopic lights, laser, or the like. In other embodiments, the Sun may be used as light source 140. In some embodiments of the present invention, light source 140 may provide specific ranges of wavelengths of light, e.g. infrared, ultraviolet, reddish, greenish, or the like, depending upon the wavelength sensitivity of PV strip. In general source 140 may provide any type of electromagnetic radiation output, and detector 150 may sense such electromagnetic radiation.

In various embodiments, light detector 150 comprises a photo detector, such as a CCD, a CMOS sensor, or the like. In operation, light detector 150 may be a two-dimensional sensor and may provide an output proportional to the intensity of light incident upon each light sensor of light detector 150.

FIG. 1B illustrates another view of an embodiment of the present invention. In this figure, sheet 100 is show from the top or bottom. As shown, sheet 100 is mounted upon a frame assembly 170. In some embodiments, sheet 100 may be supported merely by a frame portion of frame assembly 170, whereas in other embodiments, frame assembly 170 may include a piece of transparent material, e.g. glass to support sheet 100.

In FIG. 1B, a first movement arm 180 and a second movement arm 190 are shown. In various embodiments, first movement arm 180 may be constrained to move in a first direction 200, and second movement arm 190 may be constrained to move in a second direction 210. It is contemplated that first movement arm 180 and second movement arm 190 may be precisely be positioned within first direction 200 and second direction 210, respectively.

In various embodiments of the present invention, light source 140 is positioned at the intersection of first movement arm 180 and second movement arm 190. In operation, the location of light source 140 on top of sheet 100 is precisely controlled by the positioning of first movement arm 180 and second movement arm 190. In various embodiments, the accuracy of positioning of light source 140 is +/−20 microns.

A similar set of movement arms are typically provided on the opposite side of sheet 100, as shown in FIG. 1A. In various embodiments, light detector 150 is also positioned at the intersection of these movement arms. In operation, light source 140 and light detector 150 are typically precisely positioned on opposite sides of sheet 100, as will be described below.

In other embodiments of the present invention, other types of positioning mechanisms may be used. For example, a single arm robotic arm may be used to precisely position light source 140 and a single robotic arm may be used to precisely position light detector 150.

Figure 2A:
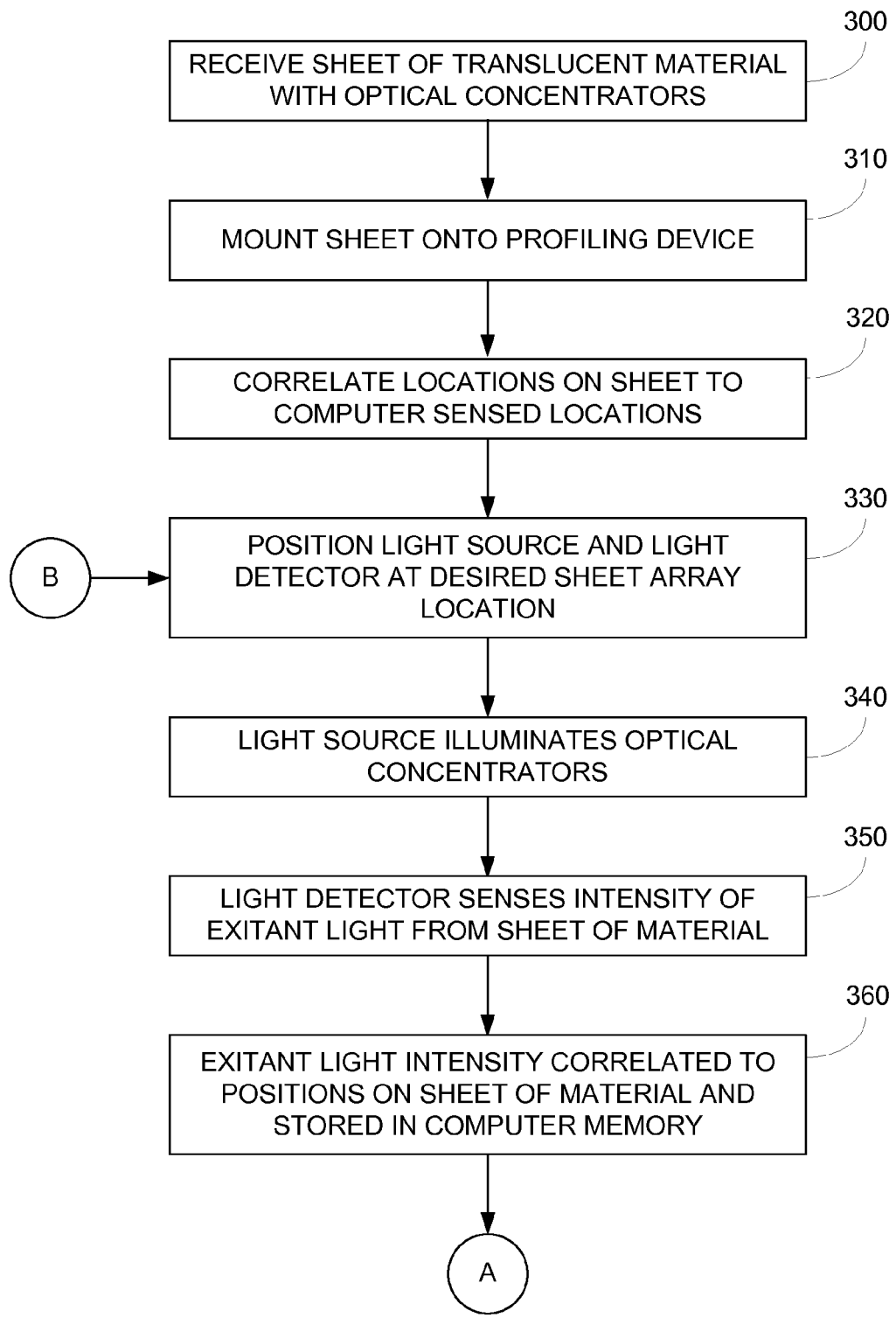
FIGS. 2A-C illustrate block diagrams of processes according to various embodiments of the present invention.
Figure 2B:
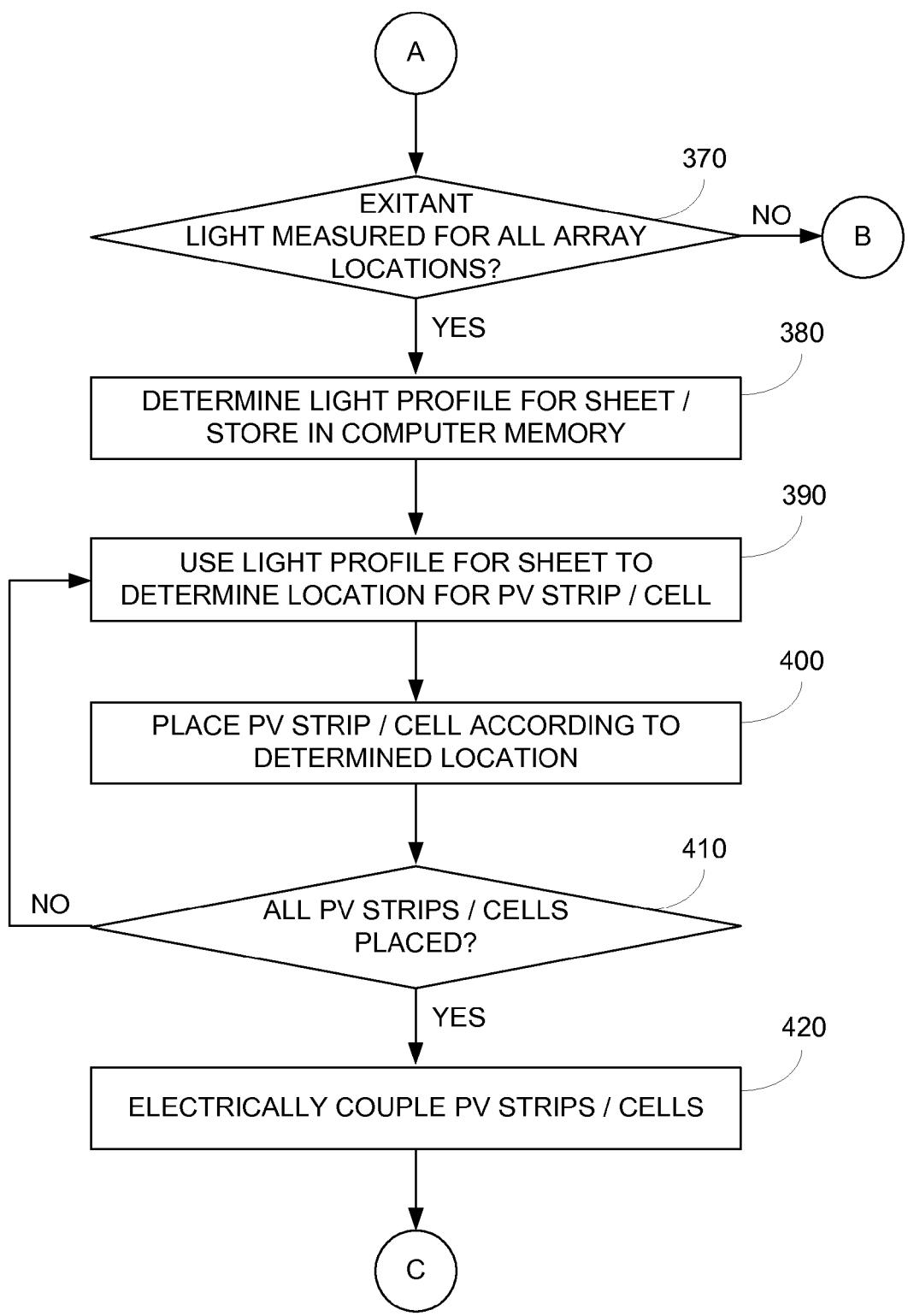

FIGS. 2A-B illustrate a block diagram of a process according to various embodiments of the present invention. For sake of convenience, reference may be made to elements illustrated in FIGS. 1A-B.

Initially, sheet 100 is provided, step 300. In various embodiments, sheet 100 may be made of various grades and qualities of glass, plastic, polycarbonate, translucent material, or the like. In various embodiments, sheet 100 includes any number or type of concentrators 110, that may be integrally formed within sheet 100. In some case, sheet 100 may be formed from an extrusion process, a molding process, a grinding/polishing process, or a combination thereof.

Next, sheet 100 is mounted upon supporting frame assembly 170, step 310. It is contemplated that sheet 100 is secured to frame assembly 170 so that the measurements performed may be accurate. As discussed above, frame assembly 170 may include a clear piece of glass, plastic, or the like to support the weight of sheet 100.

In various embodiments of the present invention, one or more calibration steps may then be performed to correlate locations on sheet 100 with the locations of light source 140 and light detector 160, step 320. For example, the corners of sheet 100 may be located in two-dimensions with respect to supporting frame assembly 170. In other embodiments, other types of calibration may be performed such as directly exposing light source 140 to light detector 150 so as to normalize the amount of light detected in the subsequent steps.

In normal operation, light source 140 and light detector 150 are positioned at a determined position, step 330. For example, if sheet 100 can be divided up into an array of locations, light source 140 and light detector 150 may be positioned at a desired location e.g. (0,0), (14,19), (32,32), or the like. Next, as light source 140 illuminates the side of sheet 100 including concentrating structures 110, step 340, light detector 150 records the intensity of light exiting the other side of sheet 100, step 350.

In various embodiments of the present invention, light detector 150 records the exitant light from portions of one or more concentrators 110. For example, the field of view of light detector 150 may record the concentration of one concentrator 110, as illustrated in FIG. 1B, or more concentrators 110.

In various embodiments of the present invention, a thin sheet of translucent/opaque material, e.g. EVA, PVB, Surlyn, thermosets material, thermoplastic material, or the like, may be disposed upon sheet 100 on the side facing light detector 150. In such embodiments, the thin sheet of material facilitates optical detection of the exitant illumination. More specifically, the locations/contours and intensity of the exitant illumination become more apparent to light detector 150 because of the diffusing properties of the material as provided by the manufacturer. In later lamination steps (heat, pressure, time) that will be described below, the diffusing properties of the thin material are greatly reduced and the thin material becomes more transparent. In various embodiments, the thin sheet of material, may be. EVA, PVB, Surlyn, thermosets material, thermoplastic material, or the like. In other embodiments the thin sheet of material may be parchment material, or the like.

In various embodiments, the detected illumination data are correlated to the array location of sheet 100 and then stored in a computer memory, step 360. In some embodiments, light detector 150 may capture and provide one or more frames of illumination data. In such embodiments, an average of the multiple frames of illumination may be used to reduce effects of spurious vibration of supporting frame assembly, transient vibrations due to movement of light source 140 and light detector 150, or the like.

In various embodiments, if the illumination data has not been captured for all array locations, step 370, the process above may be repeated for additional array locations.

Next, in various embodiments of the present invention, the stored illumination data and the array location data are used to determine an exitant light profile for sheet 100, step 380. More specifically, the light profile may include an intensity of light and an x,y coordinate for sheet 100.

In various embodiments of the present invention, based upon the exitant light profile, image processing functions may be performed to determine positioning data for placement of PV strips, step 390. For example, morphological thinning operations may be performed to determine one or more center-lines for placement of the PV strips, edge contouring operations may be performed to provide an outline for placement of the PV strips, or the like. This positioning data may also be stored in computer memory.

In some embodiments of the present invention, it is contemplated that the width of concentrated light by concentrators 110 is smaller than the narrow width of PV strips. Accordingly, in some embodiments, the concentrated light should be centered within the PV strips. It is contemplated that this would increase, e.g. maximize the collection of light of a given PV strip relative to the exitant light.

Next, the positioning data may be used by a user, or the like, to place PV strips on a backing material, step 400. In some embodiments, the positioning data, e.g. the center-lines, may be printed upon backing material, or the like, along with corner registrations. Based upon such positioning data, a user may manually place the PV strips or PV cell (groups of PV strips e.g. PV assembly, PV string, PV module) approximately along the center-lines, or the like. In other embodiments, the positioning data may be input into a robotic-type pick and place machine that picks up one or more PV strips or PV cells and places them down on a backing material, a vacuum chuck, or the like at the appropriate locations. In various examples, placement accuracy may be +/−15 microns. In various embodiments, an adhesive material, e.g. EVA, PVB, Surlyn, thermosets material, thermoplastic material or the like, may be disposed between the PV strips and the backing material.

In other embodiments of the present invention, the PV strips may be placed upon the thin layer of diffusing material described above, e.g. EVA, PVB, Surlyn, thermosets material, thermoplastic material or the like, that is placed upon the back side of sheet 100, e.g. opposite of concentrators 110.

The process may then repeat for placement of the next PV strip or PV cell, step 410, until all the desired PV strips or PV cells have been placed.

Subsequently, a soldering step may be performed to electrically couple and physically restrain one or more PV strips relative to other PV strips or one or more PV cells relative to other PV cells, step 420.

In various embodiments, a layer of adhesive material is disposed upon the soldered PV strips or PV cells, step 430. In some embodiments, the layer of adhesive material such as ethylene vinyl acetate (EVA), Polyvinyl butyral (PVB), Surlyn, thermosets material, thermoplastic material or the like, may be used. Subsequently, sheet 100 is disposed upon the layer of adhesive material, step 440. In various embodiments, any number of registration marks, or the like may be used so that sheet 100 is precisely disposed above the PV strips or PV cells. More specifically, sheet 100 should be aligned such that the PV strips are positioned at the proper positions or locations under the respective concentrators 110.

In other embodiments where the PV strips are placed upon the thin diffusing layer described above, upon sheet 100, in these steps, an additional layer of material (e.g. EVA, PVB, Surlyn, thermosets material, thermoplastic material or the like may be placed upon the PV strips, and then a backing material may be placed upon the additional adhesive layer. Accordingly, in some embodiments, the composite PV structure is formed by building on top of sheet 100, and in other embodiments, the composite PV is formed by building on top of the backing material.

In various embodiments, the resulting sandwich of materials is bonded/laminated in an oven set to a temperature above approximately 200 degrees Fahrenheit, step 450. More specifically, the temperature is typically sufficient for the adhesive layer (e.g. EVA, PVB, Surlyn, thermosets material, thermoplastic material or the like) to melt (e.g. approximately 120 degrees C., approximately 150 degrees C. or the like) and to bond: the PV strips or PV cells, the backing, and sheet 100 together. In some embodiments, in addition to bonding the materials together, as the adhesive (e.g. EVA, PVB, Surlyn, thermosets material, thermoplastic material or the like) melts, it occupies regions that were formerly gap regions between adjacent PV strips or PV cells. This melted adhesive helps prevent PV strips from moving laterally with respect to each other, and helps maintain alignment of PV strips relative to sheet 100. Additionally, the adhesive material occupies regions that were formerly gap regions between bus bars between the PV cells. As will be discussed below, the time, temperature and pressure parameters for the lamination step may be advantageously controlled.

In various embodiments, one or more wires may be stung before and/or after the bonding step to provide electrical connection between the PV strips or PV cells. These wires thus provide the electrical energy output from the completed PV panel, step 460.

Figure 3A:
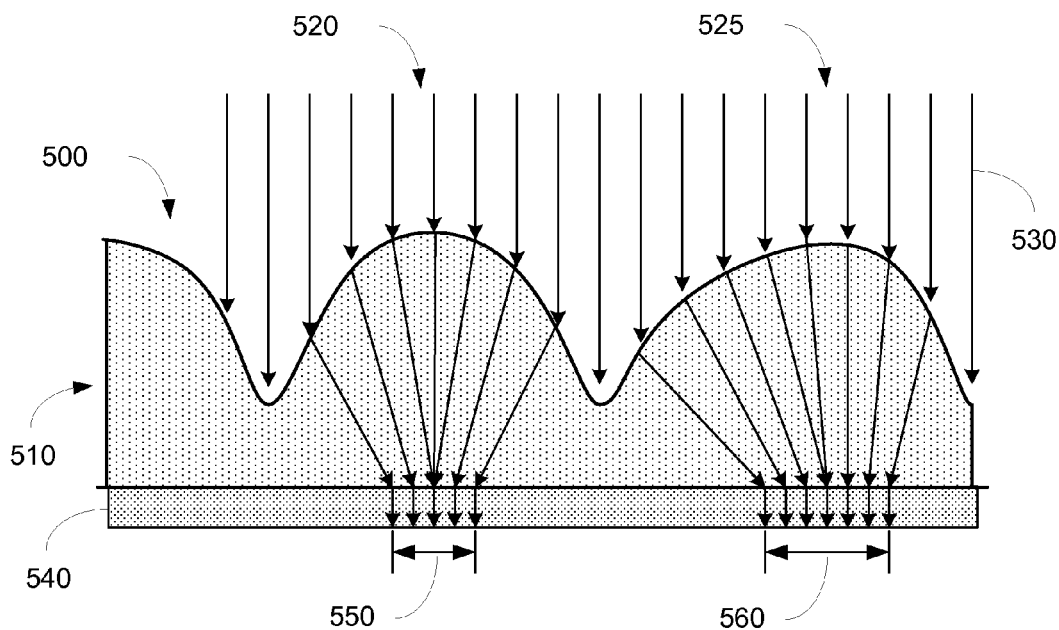
FIGS. 3A-E illustrate examples according to various embodiments of the present invention.
Figure 3B:
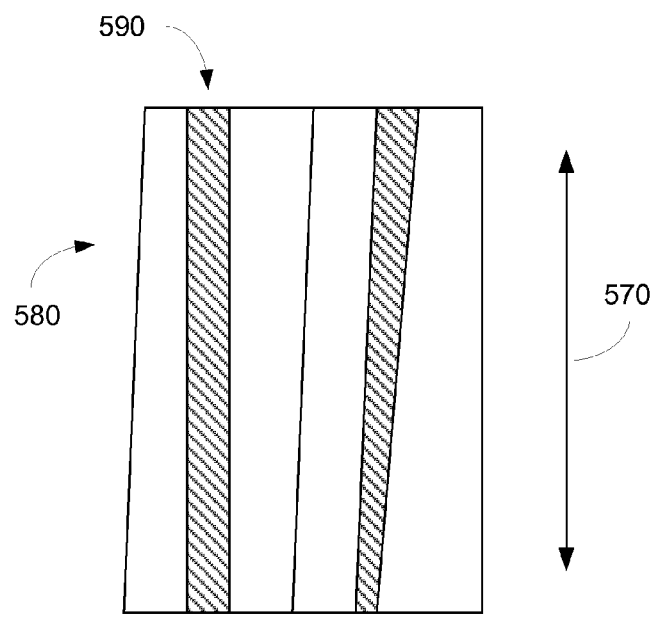
Figure 3C:
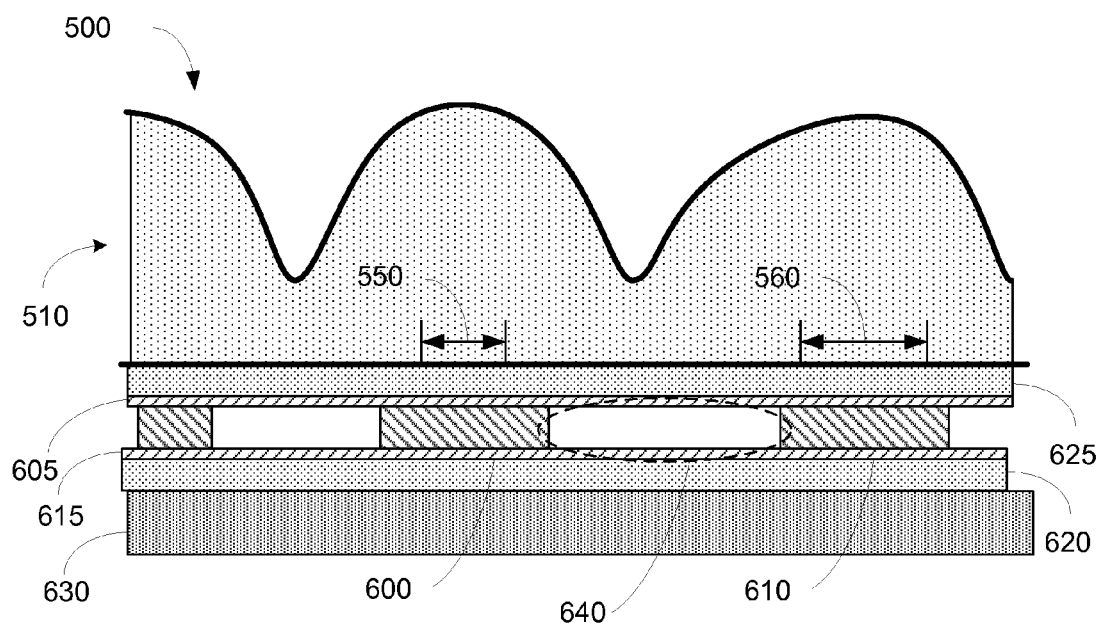

FIGS. 3A-C illustrate examples according to various embodiments of the present invention. More specifically, FIG. 3A illustrates a cross section 500 of a portion of a transparent sheet 510. As can be seen, a number of concentrators, e.g. 520 and 525 are illustrated.

In FIG. 3A, a number of parallel light rays 530 from a source of illumination are shown striking the air/glass interface, and being directed towards regions 550 and 560 (regions having concentrated light). As discussed above, a sensor captures locations of concentrated light at regions 550 and 560 on transparent sheet 510. As shown in this example, a layer of diffusing material 540 may be placed adjacent to sheet 510 to help the sensor capture the locations of regions 550 and 560. As will be discussed below, in various embodiments, the layer of diffusing material 540 may also serve as an adhesive layer. More specifically, before a lamination process (e.g. FIG. 3C), the adhesive layer tends to diffuse incident light, and after the lamination process (e.g. FIGS. 3D and E), the adhesive layer tends to secure PV strips relative to the glass sheet, and tends to become relatively transparent.

As can be seen in this embodiment, concentrators are not typically the same size, shape, or pitch. In practice, it has been determined that the pitch of concentrators may vary across a sheet from 40 microns up to 500 microns. Further, the concentrators need not be symmetric. Accordingly, the regions where the light is concentrated may widely vary for different and even adjacent concentrators. As can be seen in this example, region 560 is off-center, and region 560 is wider than region 550. In other embodiments, many other differences may become apparent in practice.

As illustrated in FIG. 3B, the width, positioning, etc. of regions of concentrated light are not necessarily or typically uniform along the extrusion axis 570 of glass sheet 510. In this example, it can be seen that the width of the concentrators 580 may vary along extrusion axis 570, the width of the concentrated light regions 590 may vary along extrusion axis 570, the concentrated light region may be off-center, and the like.

In light of the above, it can be seen that because of the wide variability of concentrator geometry of glass sheet 500, proper placement of PV strips relative to the concentrated light regions is desirable.

In the example illustrated in FIG. 3C, PV strips 600 and 610 are illustrated disposed under regions 550 and 560 of FIG. 3B. In various embodiments, the width of PV strips are typically 25% wider than the width of the concentrated light regions. In various embodiments, it is believed that if light that enters the concentrators at angles other than normal to sheet 510 (e.g. 3 to 5 degrees from normal, or greater), the light may still be incident upon the PV strips. In current examples, the width of the concentrated light regions ranges from approximately 1.8 mm to 2.2 mm, although other width region ranges are also contemplated. For example, as the quality control of sheet 510 including geometric uniformity and geometric preciseness of concentrators, clarity of the glass, or the like increase, the width of the concentrated light regions should decrease, e.g. with a lower width of approximately 0.25 mm, 0.5 mm, 1 mm, or the like.

As illustrated in FIG. 3C, PV strips 600 and 610 are adjacent to glass sheet 500 and a backing layer 630 via adhesive layers 620 and 625. As can be seen, in various embodiments, first adhesive layer 620 may be disposed between PV strips (600 and 610) and backing layer 630, and a second adhesive layer 625 may be disposed between PV strips (600 and 610) and glass sheet 500. Further, gap regions, e.g. region 640, exist between adjacent bus bars 605 and 615 and between adjacent PV strips (600 and 610). In some current embodiments, the height between adjacent bus bars is typically smaller than 200 microns.

Figure 3D:
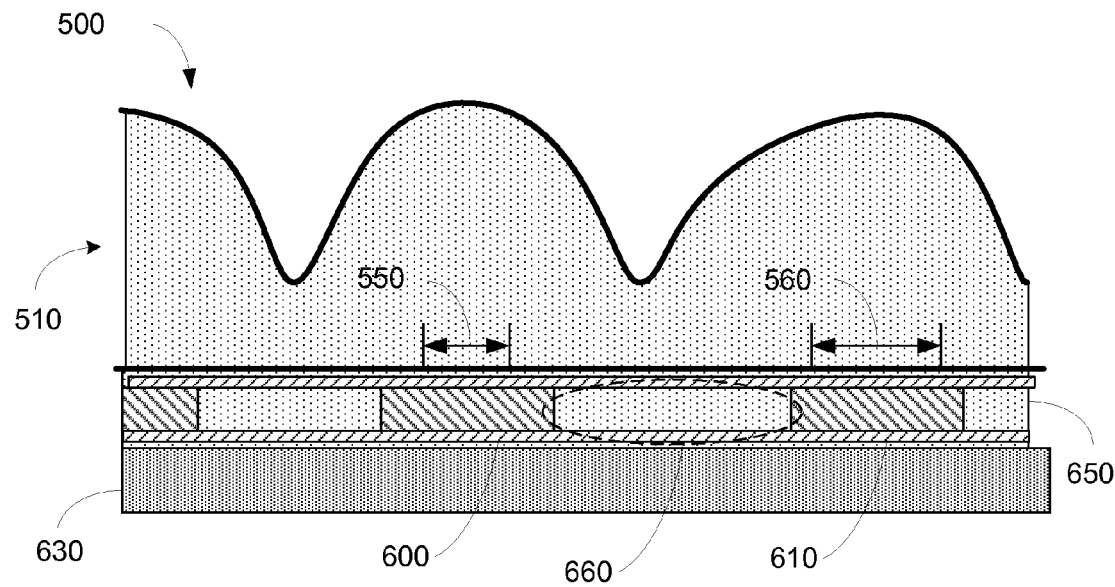
Figure 3E:
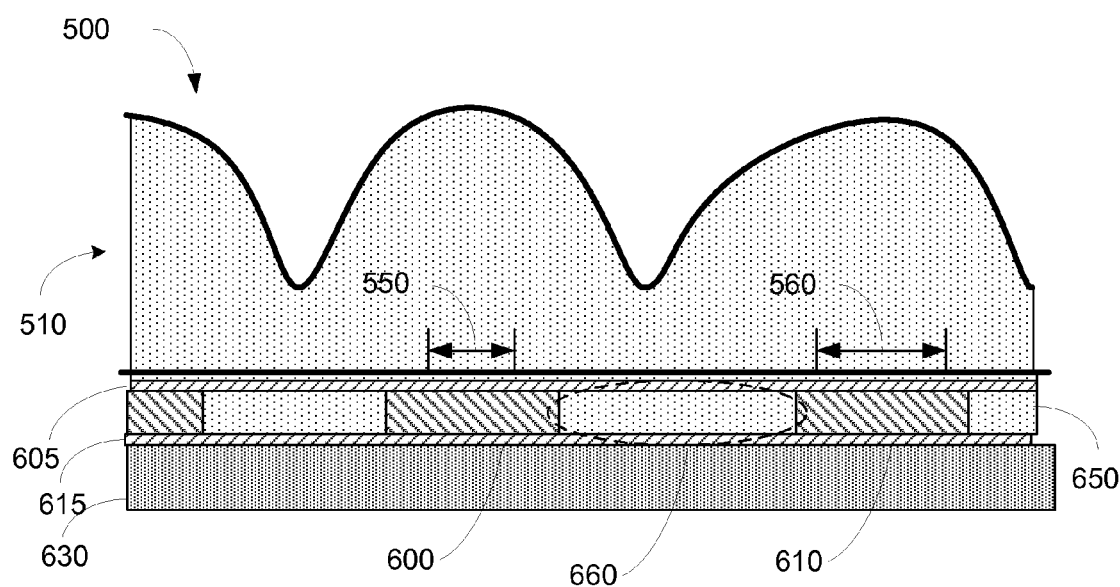

In FIG. 3D, the structure illustrated in FIG. 3C is subject to a precisely controlled lamination process. In the case of the adhesive layers being formed from layers of EVA, PVB, Surlyn, thermosets material, thermoplastic material or the like material, the first adhesive layer 620 and second adhesive layer 625 melt and reflow. As can be seen in FIG. 3D, first adhesive layer 620 and second adhesive layer 625 may mix together to form a single layer, as illustrated by adhesive layer 650. In such embodiments, voids between PV strips and bus bars, e.g. gap region 640 before lamination process, are then filled (region 660) by the adhesive material, e.g. EVA, after the lamination process. In various embodiments, the adhesive material adheres to the PV strips and/or bus bars. As a result, PV strips 600 and 610 are not only secured relative to glass sheet 500 and backing layer 630, but are also laterally secured with respect to each other by the reflowed EVA material. Additionally, the preexisting separation between bus bars 605 and 615 are maintained. In various embodiments, the adhesive material acts as a barrier to reduce solder shorts between neighboring PV strips and/or neighboring bus bars, for example, as a result of a user pushing down upon bus bars connecting PV strips. Further, the adhesive material acts as a barrier to moisture, corrosion, contaminants, and the like. In other embodiments of the present invention, a single adhesive layer may be used, as illustrated in FIG. 3E.

In various embodiments of the present invention, the lamination process includes precisely controlled time, temperature and. or physical compression variable profiles. In one example, the compression pressure pressing down upon the stack of materials ranges from approximately 0.2 to 0.6 atmospheres. In various embodiments, the lamination pressure profile includes subjecting the structure illustrated in FIG. 3C to a compression pressure of approximately 25 kPA (e.g. ¼ atmosphere) for about 25 seconds followed by a pressure of approximately 50 kPA (e.g. ½ atmosphere) for about 50 seconds. During this time period, the EVA material, or the like is heated to the melting point, e.g. approximately greater than 120 degrees C., greater than 150 degrees C., or greater, depending upon the melting point of the specific type of adhesive material.

Experimentally, the inventors have determined that if the lamination process is performed under a compression pressure of approximately 1 atm, as the adhesive material, e.g. EVA, melts and reflows, gap regions remain between adjacent PV strips and remain between bus bars between adjacent PV strips, as described above. In other embodiments of the present invention, other combinations of time, temperature and compression pressure may be determined that provide the benefits described above, without undue experimentation by one of ordinary skill in the art.

In other embodiments of the present invention, when other adhesive materials such as PVB, Surlyn, thermosets material, thermoplastic material or the like are used, the time, temperature, pressure, and the like properties may be similarly monitored by the user such that the other adhesive materials perform a similar function as the EVA material, described above. More specifically, it is desired that the adhesive material fill the air-gap regions between the PV strips, and provide the protective and preventative features described above.

Figure 4:
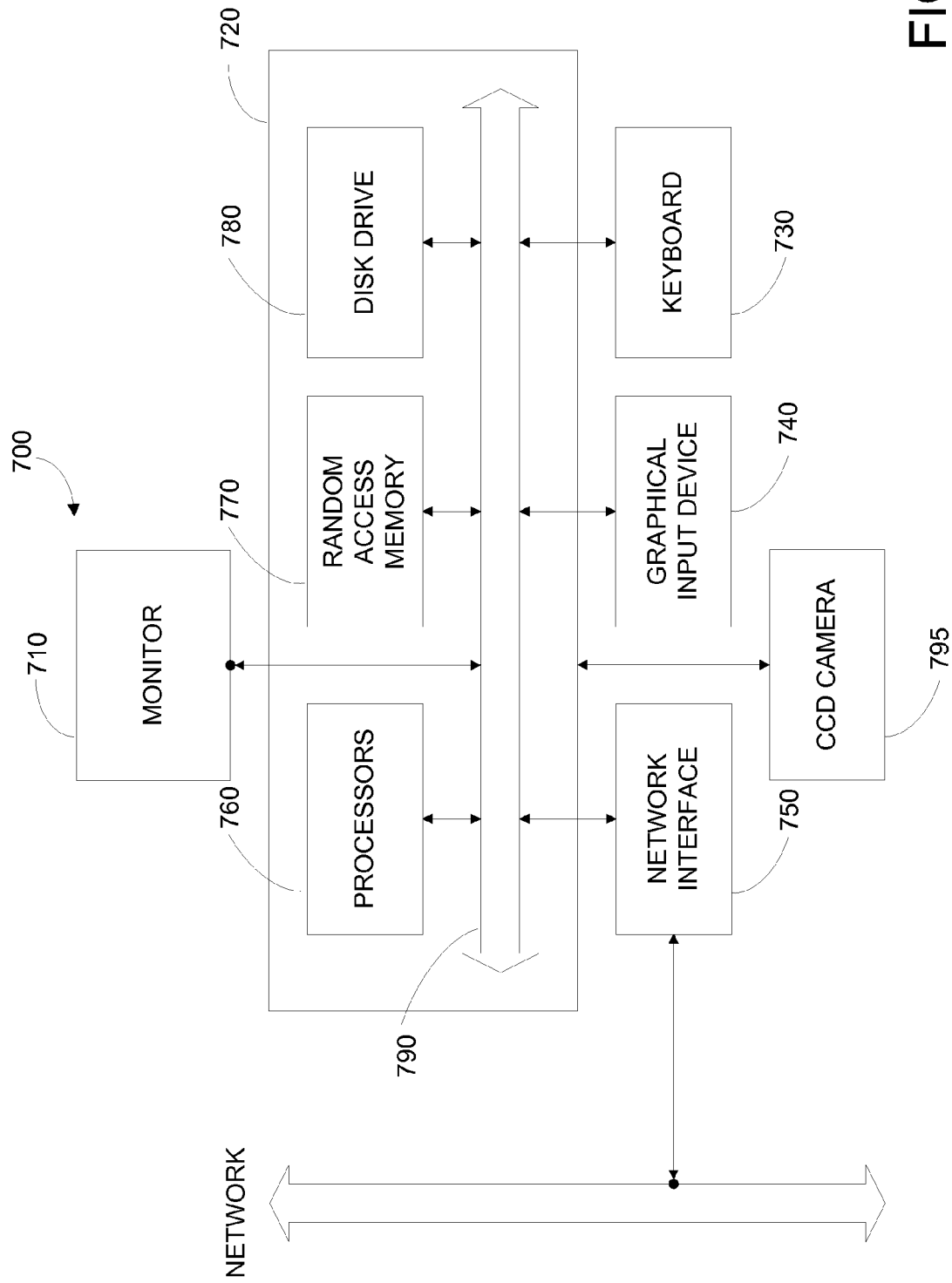
FIG. 4 illustrates a block diagram of a computer system according to various embodiments of the present invention.

FIG. 4 illustrates a block diagram of a computer system according to various embodiments of the present invention. More specifically, a computer system 600 is illustrated that may be adapted to control a light source, a light detector, and/or a PV placement device, process data, control a lamination device, and the like, as described above.

FIG. 4 is a block diagram of typical computer system 700 according to various embodiment of the present invention. In various embodiments, computer system 700 typically includes a monitor 710, computer 720, a keyboard 730, a user input device 740, a network interface 750, and the like.

In the present embodiment, user input device 740 is typically embodied as a computer mouse, a trackball, a track pad, wireless remote, and the like. User input device 740 typically allows a user to select objects, icons, text, control points and the like that appear on the monitor 710. In some embodiments, monitor 710 and user input device 740 may be integrated, such as with an interactive touch screen display or pen based display such as a Cintiq marketed by Wacom, or the like.

Embodiments of network interface 750 typically include an Ethernet card, a modem (telephone, satellite, cable, ISDN), (asynchronous) digital subscriber line (DSL) unit, and the like. Network interface 750 is typically coupled to a computer network as shown. In other embodiments, network interface 750 may be physically integrated on the motherboard of computer 720, may be a software program, such as soft DSL, or the like.

Computer 720 typically includes familiar computer components such as a processor 760, and memory storage devices, such as a random access memory (RAM) 770, disk drives 780, and system bus 790 interconnecting the above components.

Figure 2C:
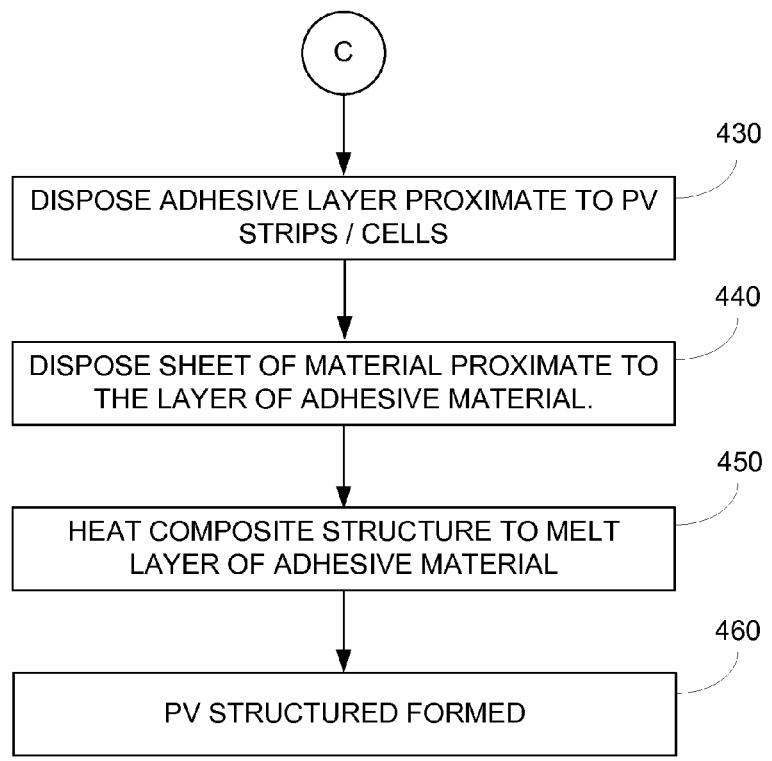

In one embodiment, computer 720 is a PC compatible computer having multiple microprocessors such as Xeon™ microprocessor from Intel Corporation. Further, in the present embodiment, computer 720 may include a UNIX-based operating system. RAM 770 and disk drive 780 are examples of tangible media for storage of non-transient: images, operating systems, configuration files, embodiments of the present invention, including computer-readable executable computer code that programs computer 720 to perform the above described functions and processes, and the like. For example, the computer-executable code may include code that directs the computer system to perform various capturing, processing, PV placement steps, or the like, illustrated in FIGS. 2A-C; code that directs the computer system to perform controlled lamination process, or the like, illustrated in FIGS. 3C-D; any of the processing steps described herein; or the like.

Other types of tangible media include floppy disks, removable hard disks, optical storage media such as CD-ROMS, DVDs, Blu-Ray disks, semiconductor memories such as flash memories, read-only memories (ROMS), battery-backed volatile memories, networked storage devices, and the like.

In the present embodiment, computer system 700 may also include software that enables communications over a network such as the HTTP, TCP/IP, RTP/RTSP protocols, and the like. In alternative embodiments of the present invention, other communications software and transfer protocols may also be used, for example IPX, UDP or the like.

FIG. 4 is representative of computer systems capable of embodying the present invention. It will be readily apparent to one of ordinary skill in the art that many other hardware and software configurations are suitable for use with the present invention. For example, the use of other microprocessors are contemplated, such as Core™ or Itanium™ microprocessors; Opteron™ or Phenom™ microprocessors from Advanced Micro Devices, Inc; and the like. Additionally, graphics processing units (GPUs) from NVidia, ATI, or the like, may also be used to accelerate rendering. Further, other types of operating systems are contemplated, such as Windows® operating system such as Windows7®, WindowsNT®, or the like from Microsoft Corporation, Solaris from Oracle, LINUX, UNIX, MAC OS from Apple Corporation, and the like.

In light of the above disclosure, one of ordinary skill in the art would recognize that many variations may be implemented based upon the discussed embodiments. For example, in one embodiment, a layer of photosensitive material approximately the same size as the glass sheet described above is disposed under the sheet of transparent material. Subsequently, the combination is exposed to sun light. Because the material is photosensitive, after a certain amount of time, regions where the light is concentrated may appear lighter or darker than other regions under the glass sheet. In such embodiments, the material can then be used as a visual template for placement of the PV strips or cells. More specifically, a user can simply place PV strips at regions where the light is concentrated. Once all PV strips are placed, the photosensitive material may be removed or be used as part of the above-mentioned backing. As can be seen in such embodiments, a computer, a digital image sensor, a precise x-y table, or the like are not required to practice embodiments of the present invention.

In other embodiments of the present invention, a displacement sensor, e.g. a laser measurement device, a laser range finder, or the like may be used. More specifically, a laser displacement sensor may be used in conjunction with steps 300-380 in FIGS. 2A-B. In such embodiments, the measured and determined light profile of step 380 is determined, as discussed above. In addition, a laser displacement sensor may be used to geometrically measure the surface of the sheet of transparent material, e.g. glass. It is contemplated that a precise measured geometric surface of the transparent sheet is then determined. In some embodiments of the present invention a Keyence LK CCD laser displacement sensor, or the like can be used.

In such embodiments, the measured geometric model of the transparent sheet and the determined light profile are then correlated to each other. In various embodiments, any number of conventional software algorithms can be used to create a computer model of the transparent material. This computer model that correlates as input, a description of a geometric surface and then outputs a predicted exitant light location. In various embodiments, a number of transparent sheets may be subject to steps 300-380 to determine a number of light profiles, and subject to laser measurement to determine a number of measured geometric surfaces. In various embodiments, the computer model may be based upon these multiple data samples.

Subsequently, in various embodiments of the present invention, a new transparent sheet may be provided. This new transparent sheet would then be subject to laser measurement to determine the measured geometric surface. Next, based upon the measured geometric surface and the computer model determined above, the computer system can then predict the locations of exitant illumination from the new transparent sheet. In various embodiments, steps 390-460 may then be performed using the predicted exitant illumination locations.

In other embodiments of the present invention, other types of measurement devices may be used besides a laser, such as a physical probe, or the like.

In other embodiments of the present invention, PV strips may be placed on top of an EVA layer, or the like directly on the bottom surface of the glass concentrators. These materials may then be subject to heat treatment, as described above. Accordingly, in such embodiments, a rigid backing material may not be needed. In still other embodiments, a light source may be an area light source, a line light source, a point light source, or the light. Additionally, a light may be a 2-D CCD array, a line array, or the like.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope.

What is claimed is:

1. A method for forming a photovoltaic module comprising:
   providing a sheet of transparent material having a plurality of light concentrating geometric features;
   mounting the sheet of transparent material on a profiling device;
   subjecting the sheet of transparent material to incident light;
   capturing a light profile of the transparent material using a sensing device to determine the light profile for the sheet of transparent material;
   storing information associated with the light profile for the sheet of transparent material in a memory of a computing device;
   using the light profile from the memory in determining the exitant light characteristics of the plurality of light concentrating geometric features and locating a plurality of correlated positions on the transparent material for placement of a plurality of photovoltaic strips;
   disposing a first layer of adhesive material adjacent to the sheet of transparent material;
   disposing the plurality of photovoltaic strips adjacent to the first layer of adhesive material, wherein the plurality of photovoltaic strips are positioned relative to the sheet of transparent material in response to the light profile comprising exitant light characteristics of the plurality of light concentrating geometric features, wherein each of the plurality of photovoltaic strips are coupled via an associated plurality of bus bars, wherein a plurality of gap regions are located between bus bars between neighboring photovoltaic strips from the plurality of photovoltaic strips;
   disposing a rigid layer of material adjacent to the plurality of photo voltaic strips to form a composite photovoltaic structure; and
   laminating the composite photovoltaic structure to fill the plurality of gap regions with adhesive material and to form the laminated photovoltaic structure, wherein adhesive material adheres to the bus bars.

2. The method of claim 1 wherein before laminating the composite photovoltaic structure, the method further comprises:
   disposing a second layer of adhesive material adjacent to the plurality of photovoltaic strips, wherein the second layer of adhesive material is located between the plurality of photovoltaic strips and the rigid layer of material and causing the adhesive material to become transparent during the laminating; and
   isolating a pair of bus bars and maintaining a determined separation between the pair of bus bars using the adhesive material filling gap regions located between the pair of bus bars during the laminating.

3. The method of claim 1 wherein laminating the composite photovoltaic structure comprises:
   subjecting the composite photovoltaic structure to a compression pressure less than an atmospheric pressure;
   wherein the sensing device comprises a light sensor, a CMOS sensor, or a CCD sensor; and wherein the incident light is selected from a light source.

4. The method of claim 3 wherein the compression pressure is selected from a compression pressure from a range of pressures including: approximately 0.2 atmospheres to approximately 0.6 atmospheres.

5. The method of claim 1 wherein laminating the composite photovoltaic structure comprises:
   subjecting the composite photovoltaic structure to a first compression pressure-level for a first period of time; and
   subjecting the composite photovoltaic structure to a second compression pressure level for a second period of time;
   wherein the first compression pressure level is lower than the second compression pressure level.

6. The method of claim 5 wherein the first compression pressure level is selected from a group consisting of approximately 25 kPA, and approximately ¼ Atmospheres; and wherein the second compression pressure level is selected from a group consisting of approximately 50 kPA and approximately ½ Atmospheres.

7. The method of claim 5 wherein laminating the composite photovoltaic structure further comprises subjecting the composite photovoltaic structure to a temperature sufficient to melt the adhesive material; and wherein the temperature is greater than approximately 120 degrees Centigrade.

8. A method for forming a photovoltaic module comprising:
   providing a sheet of transparent material having a plurality of light concentrating geometric features;
   processing the sheet of transparent material on a profiling device to capture a light profile of the transparent material using a sensing device;
   storing information associated with the light profile for the sheet of transparent material in a memory of a computing device;
   disposing a first layer of adhesive material adjacent to the sheet of transparent material;
   disposing the plurality of photovoltaic strips adjacent to the first layer of adhesive material, wherein the plurality of photovoltaic strips are positioned relative to the sheet of transparent material in response to the light profile the plurality of light concentrating geometric features, wherein each of the plurality of photovoltaic strips are coupled via an associated plurality of bus bars, wherein a plurality of gap regions are located between bus bars between neighboring photovoltaic strips from the plurality of photovoltaic strips;
   disposing a rigid layer of material adjacent to the plurality of photo voltaic strips to form a composite photo voltaic structure;
   laminating the composite photovoltaic structure to fill the plurality of gap regions with adhesive material and to form the laminated photovoltaic structure, wherein adhesive material adheres to the bus bars;
   causing the adhesive material to become transparent during the laminating; and
   isolating a pair of bus bars and maintaining a determined separation between the pair of bus bars using the adhesive material filling gap regions located between the pair of bus bars during the laminating.

9. The method of claim 8 further comprising providing a second layer of adhesive material between the plurality of photovoltaic strips and the rigid layer of material.

10. The method of claim 8 wherein the first layer of adhesive material is selected from a group consisting of an EVA, a PVB, a thermosets material, and thermoplastic material.

* * * * *